United States Patent
Koide et al.

(10) Patent No.: US 10,838,275 B2
(45) Date of Patent: Nov. 17, 2020

(54) DISPLAY DEVICE

(71) Applicant: Japan Display Inc., Minato-ku (JP)

(72) Inventors: Gen Koide, Minato-ku (JP); Hiroyuki Abe, Minato-ku (JP); Kazune Matsumura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/442,768

(22) Filed: Jun. 17, 2019

(65) Prior Publication Data

US 2019/0391454 A1 Dec. 26, 2019

(30) Foreign Application Priority Data

Jun. 25, 2018 (JP) .................................. 2018-120231

(51) Int. Cl.
*G02F 1/1362* (2006.01)
*H01L 27/12* (2006.01)
*G02F 1/1345* (2006.01)

(52) U.S. Cl.
CPC ...... *G02F 1/136286* (2013.01); *G02F 1/1345* (2013.01); *H01L 27/124* (2013.01)

(58) Field of Classification Search
CPC .................................................. G02B 5/3058
See application file for complete search history.

(56) References Cited

U.S. PATENT DOCUMENTS

| | | | | |
|---|---|---|---|---|
| 2009/0189835 A1* | 7/2009 | Kim | ..................... | G09G 3/3677 345/80 |
| 2009/0195481 A1* | 8/2009 | Taguchi | .................. | G02B 5/201 345/55 |
| 2012/0001835 A1* | 1/2012 | Yamamoto | .......... | G02F 1/13454 345/55 |
| 2016/0247478 A1* | 8/2016 | Ishige | .................. | G09G 3/3677 |
| 2016/0300863 A1* | 10/2016 | Koide | ................. | H01L 27/3276 |
| 2017/0123285 A1* | 5/2017 | Suzuki | ............. | G02F 1/133345 |
| 2019/0043439 A1 | 2/2019 | Ishige | | |

FOREIGN PATENT DOCUMENTS

JP  2016-148751  8/2016

* cited by examiner

*Primary Examiner* — Sang V Nguyen
(74) *Attorney, Agent, or Firm* — Oblon, McClelland, Maier & Neustadt, L.L.P.

(57) ABSTRACT

According to an aspect, a display device includes: a substrate; a display region; a peripheral region; signal lines; terminals; wires coupling the terminals and the signal lines in the peripheral region; and first and second metal layers in different layers perpendicularly to the substrate and an insulating film in the peripheral region. The peripheral region includes: a first wiring region, in which the wires are electrically coupled to the signal lines; a second wiring region between the first wiring region and the terminals, and in which at least one or more wires pass through the first and second metal layers; and a third wiring region between the first and second wiring regions, and in which the wires extend in a second direction intersecting the first direction. The third wiring region includes contacts coupling the first and second metal layers, and a virtual line connecting the contacts has a curved shape.

13 Claims, 13 Drawing Sheets

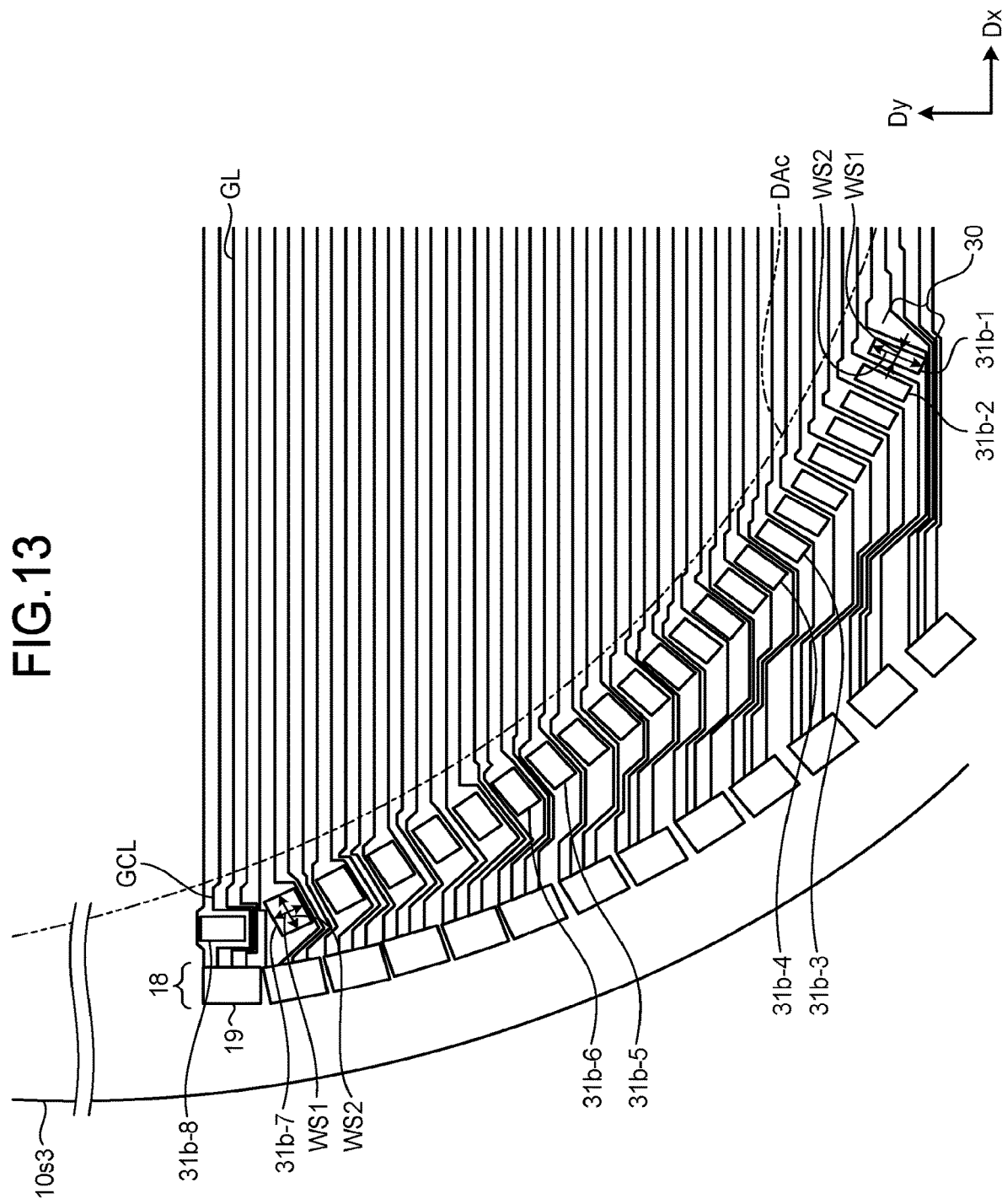

DISPLAY DEVICE

CROSS-REFERENCE TO RELATED APPLICATIONS

This application claims priority from Japanese Application No. 2018-120231, filed on Jun. 25, 2018, the contents of which are incorporated by reference herein in its entirety.

BACKGROUND

1. Technical Field

The present disclosure relates to a display device.

2. Description of the Related Art

The display device described in Japanese Patent Application Laid-open Publication No. 2016-148751 (JP-A-2016-148751) includes a display region having a shape other than a rectangle. The display device described in JP-A-2016-148751 is also called an irregular-shaped display. In the display device, multitudes of lead lines coupled to signal lines are provided in a peripheral region serving as a non-display region. The peripheral region is provided with a signal line coupling circuit and a gate driver. The signal line coupling circuit switches coupling and decoupling between the signal lines and the lead lines. The gate driver includes a plurality of shift registers.

Display devices are required to have a peripheral region with a smaller area. In irregular-shaped displays, however, it may possibly be difficult to efficiently dispose the signal line coupling circuit and multitudes of lead lines in the peripheral region disposed in an extending direction of the signal lines with respect to the display region.

SUMMARY

According to an aspect, a display device includes: a substrate; a display region provided with a plurality of pixels; a peripheral region positioned between an edge of the substrate and the display region; a plurality of signal lines, each of which is coupled to switching elements provided to the respective pixels, and that are arrayed in a first direction; a plurality of terminals arrayed in the first direction in the peripheral region of the substrate; a plurality of wires, each of which couples one of the terminals and at least one of the signal lines in the peripheral region; a first metal layer and a second metal layer provided in different layers in a direction perpendicular to the substrate in the peripheral region; and an insulating film provided between the first metal layer and the second metal layer in the peripheral region. The peripheral region includes: a first wiring region, in which each of the wires is formed in a layer different from the first metal layer and is electrically coupled to at least one of the signal lines; a second wiring region provided between the first wiring region and the terminals, and in which at least one or more of the wires pass through the first metal layer and the second metal layer; and a third wiring region provided between the first wiring region and the second wiring region, and in which the wires extend in a second direction intersecting the first direction. The third wiring region includes a plurality of contacts, each of which couples the first metal layer and the second metal layer, and a virtual line connecting the contacts has a curved shape.

BRIEF DESCRIPTION OF THE DRAWINGS

FIG. 13 is a plan view illustrating arrangement of the switching circuits, transfer circuits, and scanning lines.

DETAILED DESCRIPTION

Figure 1:
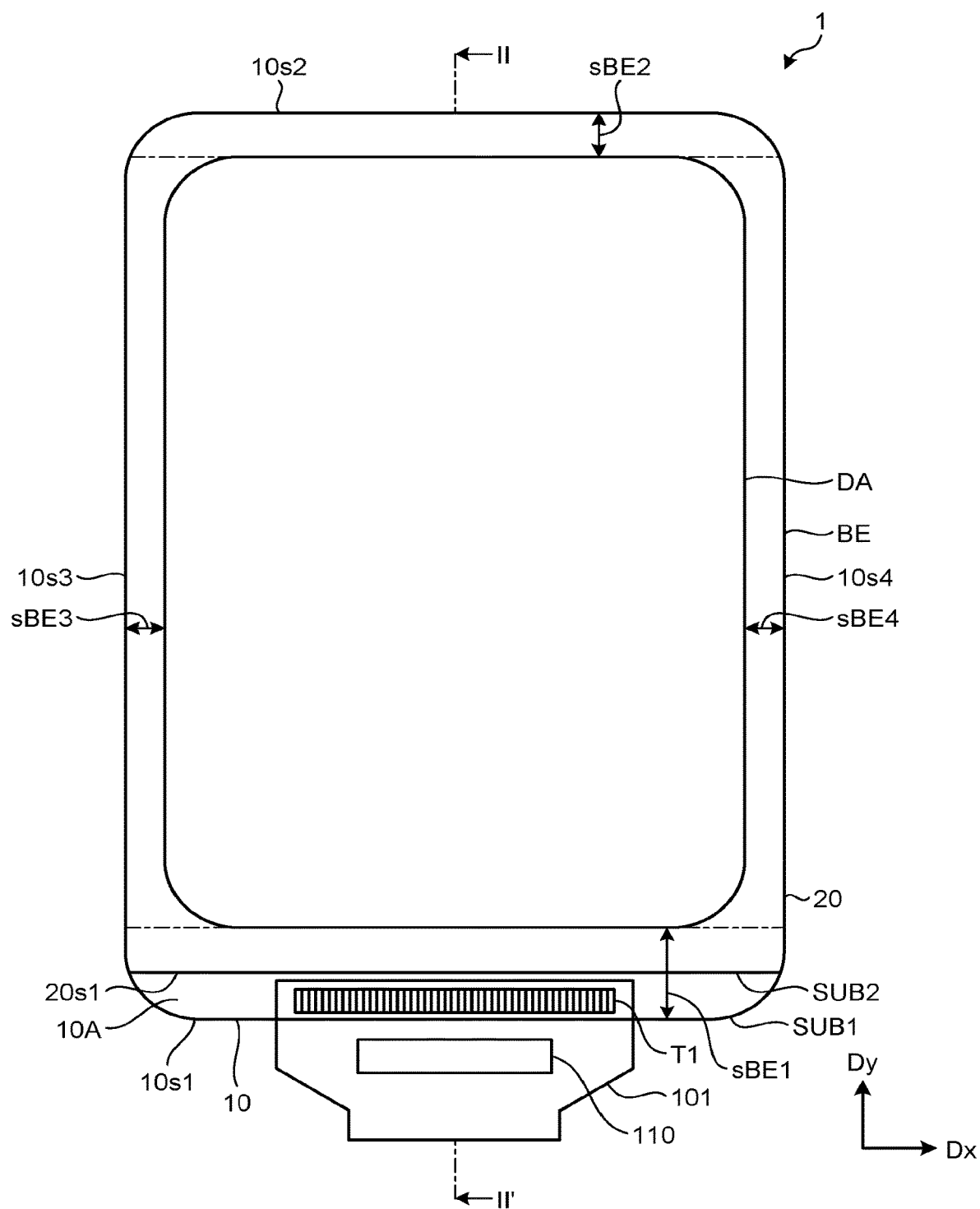
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted. In this disclosure, when an element A is described as being "on" another element B, the element A can be directly on the other element B, or there can be one or more elements between the element A and the other element B.

First Embodiment

Figure 2:
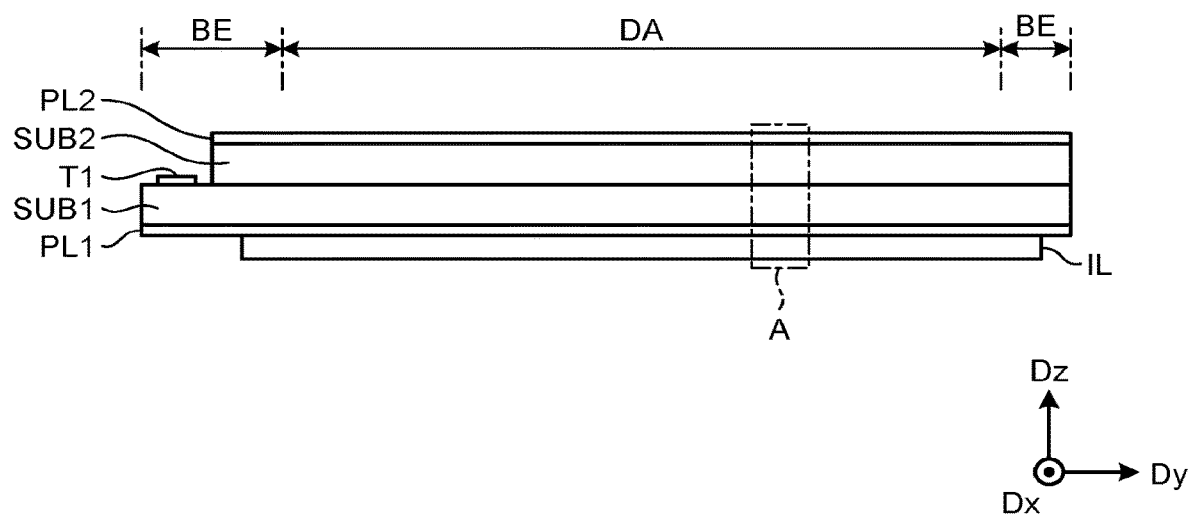
FIG. 2 is a sectional view along line II-II' in FIG. 1.
Figure 3:
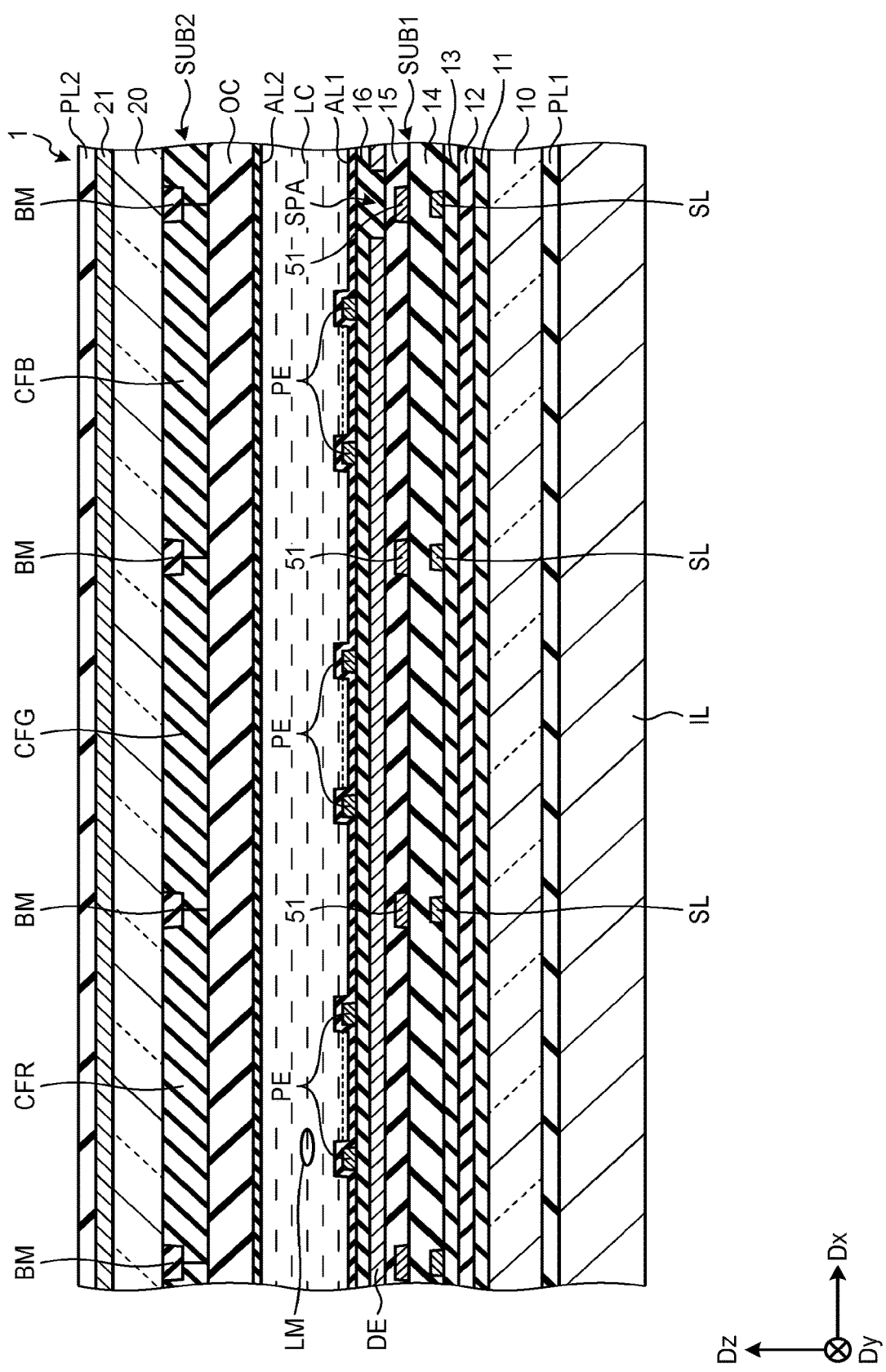
FIG. 3 is an enlarged sectional view of a region A in FIG. 2.

FIG. 1 is a plan view schematically illustrating a display device according to a first embodiment. FIG. 2 is a sectional view along line II-II' in FIG. 1. FIG. 3 is an enlarged sectional view of a region A in FIG. 2. As illustrated in FIG. 1, a display device 1 includes an array substrate SUB1 and a counter substrate SUB2. The display device 1 has a peripheral region BE outside a display region DA. While the display region DA has a substantially rectangular shape with curved corners, the outer shape of the display region DA is not particularly limited. The display region DA may have a cut-out or have another polygonal shape, for example. The display region DA may have another shape, such as a circular or elliptic shape.

A first direction Dx according to the present embodiment extends along the short side of the display region DA. A second direction Dy intersects (or is orthogonal to) the first direction Dx. These directions are not limited thereto, and the second direction Dy may intersect the first direction Dx at an angle other than 90 degrees. The plane defined by the first direction Dx and the second direction Dy is parallel to the surface of the array substrate SUB1. A third direction Dz orthogonal to the first direction Dx and the second direction Dy is the thickness direction of the array substrate SUB1.

The display region DA is a region for displaying an image and overlaps a plurality of pixels PX. The peripheral region BE refers to a region inside the outer periphery of the array substrate SUB1 and outside the display region DA. The peripheral region BE may have a frame shape surrounding the display region DA. In this case, the peripheral region BE may also be referred to as a frame region.

A first insulating substrate 10 included in the array substrate SUB1 has a first side 10s1, a second side 10s2, a third side 10s3, and a fourth side 10s4. The first side 10s1 extends along the first direction Dx in planar view. The second side 10s2 faces the first side 10s1. The third side 10s3 extends along the second direction Dy. The fourth side 10s4 faces the third side 10s3.

The peripheral region BE includes a first partial peripheral region sBE1, a second partial peripheral region sBE2, a third partial peripheral region sBE3, and a fourth partial peripheral region sBE4. The first partial peripheral region sBE1 according to the present embodiment is a region between the first side 10s1 and a virtual line (indicated by the alternate long and two short dashes line) extending from the linear part of the short side of the display region DA. The second partial peripheral region sBE2 is a region between the second side 10s2 and a virtual line extending from the linear part of the short side of the display region DA. The third partial peripheral region sBE3 and the fourth partial peripheral region sBE4 are disposed between the first partial peripheral region sBE1 and the second partial peripheral region sBE2 and extend along the third side 10s3 and the fourth side 10s4, respectively.

As illustrated in FIGS. 1 and 2, the length of the array substrate SUB1 in the second direction Dy is longer than that of the counter substrate SUB2 in the second direction Dy. As illustrated in FIG. 1, the first insulating substrate 10 has a first protrusion 10A. The first protrusion 10A is a part protruding toward the outer side than a first side 20s1 of a second insulating substrate 20 in planar view.

A plurality of terminals T1 are provided on the first protrusion 10A. The terminals T1 are disposed side by side in the first direction Dx along the first side 10s1 in the first partial peripheral region sBE1. The first protrusion 10A is also provided with a wiring substrate 101. The wiring substrate 101 is composed of, for example, flexible printed circuits (FPC). The wiring substrate 101 is coupled to the terminals T1 on the first insulating substrate 10 by film on glass (FOG) technology using an anisotropic conductive film (ACF) (hereinafter, referred to as "FOG mounting"). With this configuration, wires of the first insulating substrate 10 are electrically coupled to respective wires of the wiring substrate 101.

A driver integrated circuit (IC) 110 is provided on the wiring substrate 101. The driver IC 110 includes a control circuit, a detection circuit, an analog front end, and other components that control display on the display device 1. The driver IC 110 is mounted on the wiring substrate 101 by chip on film (COF) technology using an ACF (hereinafter, referred to as "COF mounting"), for example. The mounting form of the driver IC 110 is not limited thereto, and the driver IC 110 may be mounted on the first insulating substrate 10 by chip on glass (COG) mounting. In this case, the driver IC 110 is provided between the terminals T1, to which the wiring substrate 101 is coupled, and a signal line coupling circuit 30 (refer to FIG. 5). The driver IC 110 is not necessarily provided at the position described above and may be provided on a control substrate or a flexible substrate outside the module, for example.

As illustrated in FIGS. 2 and 3, the counter substrate SUB2 faces the array substrate SUB1 in a direction perpendicular to the surface of the array substrate SUB1. A liquid crystal layer LC is provided between the array substrate SUB1 and the counter substrate SUB2.

As illustrated in FIG. 3, the array substrate SUB1 includes the translucent first insulating substrate 10, such as a glass substrate and a resin substrate, serving as a base. The array substrate SUB1 includes a first insulating film 11, a second insulating film 12, a third insulating film 13, a fourth insulating film 14, a fifth insulating film 15, a sixth insulating film 16, signal lines SL, pixel electrodes PE, detection electrodes DE, a first orientation film AL1, and other components on one side of the first insulating substrate 10, the one side facing the counter substrate SUB2.

In the present specification, a direction from the first insulating substrate 10 to the second insulating substrate 20 in the direction perpendicular to the first insulating substrate 10 is referred to as an "upper side" or simply referred to as "on" or "above". A direction from the second insulating substrate 20 to the first insulating substrate 10 is referred to as a "lower side" or simply referred to as "below". The "planar view" indicates a view seen in the direction perpendicular to the first insulating substrate 10.

The first insulating film 11 is positioned on the first insulating substrate 10. The second insulating film 12 is positioned on the first insulating film 11. The third insulating film 13 is positioned on the second insulating film 12. The signal lines SL are positioned on the third insulating film 13. The fourth insulating film 14 is positioned on the third insulating film 13 and covers the signal lines SL.

Sensor wires 51 are positioned on the fourth insulating film 14. The sensor wires 51 face the respective signal lines SL with the fourth insulating film 14 interposed therebetween. In other words, the sensor wires 51 overlap the respective signal lines SL. The sensor wires 51 are covered with the fifth insulating film 15. The first insulating film 11, the second insulating film 12, the third insulating film 13, and the sixth insulating film 16 are made of a translucent inorganic material, such as silicon oxide and silicon nitride. The fourth insulating film 14 and the fifth insulating film 15 are made of a translucent resin material and have a thickness larger than that of the other insulating films made of the inorganic material. The fifth insulating film 15 may be made of an inorganic material.

The detection electrodes DE are positioned on the fifth insulating film 15. The detection electrodes DE each face a plurality of sensor wires 51 with the fifth insulating film 15 interposed therebetween. Slits SPA between the detection electrodes DE are each positioned right above the sensor wire 51. The detection electrodes DE are covered with the sixth insulating film 16. The sixth insulating film 16 is made of a translucent inorganic material, such as silicon oxide and silicon nitride.

The pixel electrodes PE are positioned on the sixth insulating film 16 and face the detection electrodes DE with the sixth insulating film 16 interposed therebetween. The pixel electrodes PE and the detection electrodes DE are made of a translucent conductive material, such as indium tin oxide (ITO) and indium zinc oxide (IZO). The pixel electrodes PE are covered with the first orientation film AL1. The first orientation film AL1 also covers the sixth insulating film 16.

The counter substrate SUB2 includes the translucent second insulating substrate 20, such as a glass substrate and a resin substrate, serving as a base. The counter substrate SUB2 includes a light-spieling layer BM, color filters CFR, CFG, and CFB, an overcoat layer OC, a second orientation film AL2, and other components on one side of the second insulating substrate 20, the one side facing the array substrate SUB1. The counter substrate SUB2 includes a conductive layer 21 on the other side of the second insulating substrate 20, the other side facing away from the array substrate SUB1.

The light-shielding layer BM is positioned on the one side of the second insulating substrate 20, the one side facing the array substrate SUB1. The light-shielding layer BM defines openings facing the respective pixel electrodes PE. The light-shielding layer BM is made of a black resin material or a light-shielding metal material.

The color filters CFR, CFG, and CFB are positioned on the one side of the second insulating substrate 20, the one side facing the array substrate SUB1. The edges of the color filters CFR, CFG, and CFB overlap the light-shielding layer BM. The color filters CFR, CFG, and CFB are made of resin materials in red, green, and blue, respectively, for example.

The overcoat layer OC covers the color filters CFR, CFG, and CFB. The overcoat layer OC is made of a translucent resin material. The second orientation film AL2 covers the overcoat layer OC. The first orientation film AL1 and the second orientation film AL2 are made of a horizontally oriented material, for example.

The array substrate SUB1 and the counter substrate SUB2 are disposed such that the first orientation film AL1 and the second orientation film AL2 face each other. The liquid crystal layer LC is sealed between the first orientation film AL1 and the second orientation film AL2. The liquid crystal layer LC is made of a negative liquid crystal material having negative dielectric anisotropy or a positive liquid crystal material having positive dielectric anisotropy.

The array substrate SUB1 faces a backlight unit IL, and the counter substrate SUB2 is positioned on the display surface side. The backlight unit IL may have various kinds of forms, but detailed explanation of its configuration is omitted.

The conductive layer 21 is provided on the second insulating substrate 20. The conductive layer 21 is made of a translucent conductive material, such as ITO. Static electricity applied from the outside and accumulated in a polarizing plate PL2 passes through the conductive layer 21. The display device 1 can remove the static electricity in a short period of time and reduce the static electricity applied to the liquid crystal layer LC serving as a display layer. Consequently, the display device 1 can have higher electrostatic discharge (ESD) resistance.

An optical element including a polarizing plate PL1 is disposed on the outer surface of the first insulating substrate 10 or the surface facing the backlight unit IL. An optical element including the polarizing plate PL2 is disposed on the outer surface of the second insulating substrate 20 or the surface on the observation position side. A first polarization axis of the polarizing plate PL1 and a second polarization axis of the polarizing plate PL2 are in a crossed Nicols positional relation on the X-Y plane, for example. The optical elements including the polarizing plate PL1 and the polarizing plate PL2 may include other optical functional elements, such as a phase-contrast plate.

Assume that the liquid crystal layer LC is made of a negative liquid crystal material. When no voltage is applied to the liquid crystal layer LC, liquid crystal molecules LM are initially oriented with their long axes extending along the first direction Dx on the X-Y plane. When a voltage is applied to the liquid crystal layer LC, that is, in an on-state when an electric field is formed between the pixel electrodes PE and the detection electrodes DE, the orientation state of the liquid crystal molecules LM is changed by the effects of the electric field. In the on-state, the polarization state of incident linearly polarized light is changed depending on the orientation state of the liquid crystal molecules LM when the light passes through the liquid crystal layer LC.

Figure 4:
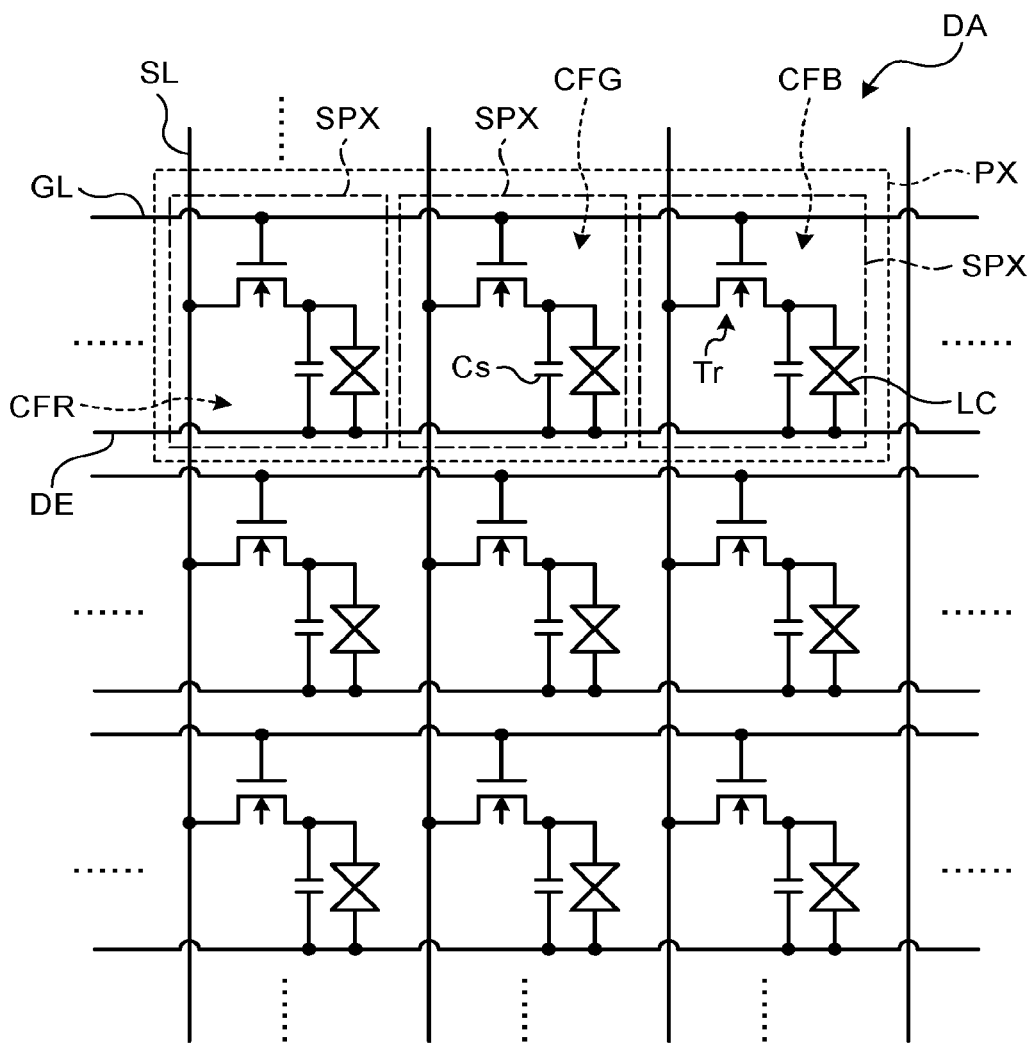
FIG. 4 is a circuit diagram of a pixel array in a display region.

FIG. 4 is a circuit diagram of a pixel array in the display region. The array substrate SUB1 is provided with switching elements Tr of respective sub-pixels SPX, the signal lines SL, scanning lines GL, and other components illustrated in FIG. 4. The signal lines SL are wiring that supplies pixel signals to the pixel electrodes PE (refer to FIG. 3). The scanning lines GL are wiring that supplies gate signals (scanning signals) for driving the switching elements Tr.

The pixels PX each include a plurality of sub-pixels SPX. The sub-pixels SPX each include the switching element Tr and capacitance of the liquid crystal layer LC. The switching element Tr is a thin-film transistor and is an re-channel metal oxide semiconductor (MOS) TFT in this example. The sixth insulating film 16 is provided between the pixel electrodes PE and the detection electrodes DE illustrated in FIG. 3, thereby forming holding capacitance Cs illustrated in FIG. 4.

The color filters CFR, CFG, and CFB illustrated in FIG. 3 are cyclically arrayed color regions in respective three colors of red (R), green (G), and blue (B), for example. The color regions in the three colors of R, G, and B serve as a set and correspond to the respective sub-pixels SPX. The set of the sub-pixels SPX corresponding to the respective color regions in the three colors serves as one pixel PX. The color filters may include color regions in four or more colors. In this case, the pixels PX may each include four or more sub-pixels SPX.

Figure 5:
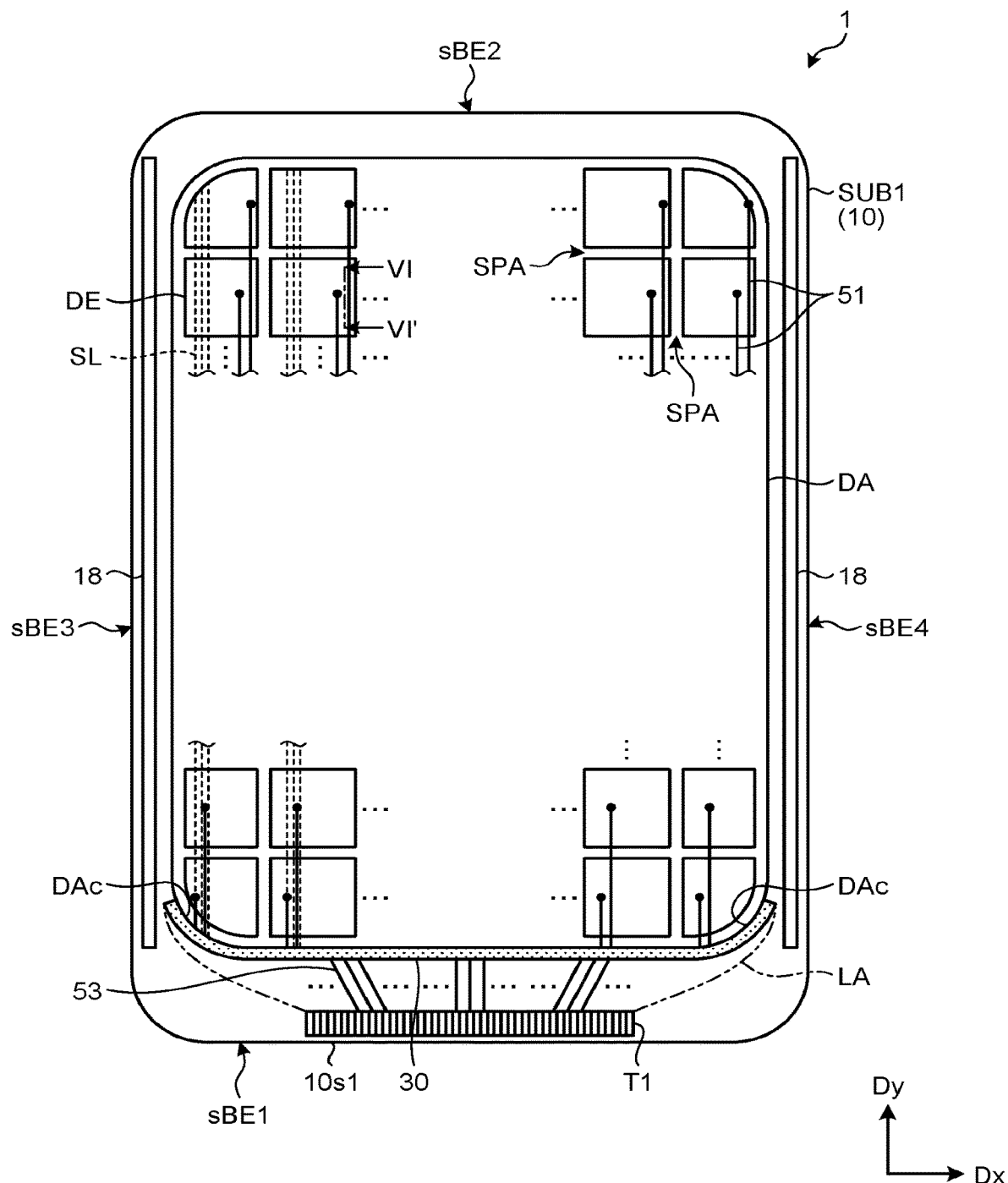
FIG. 5 is a plan view schematically illustrating an array substrate.
Figure 6:
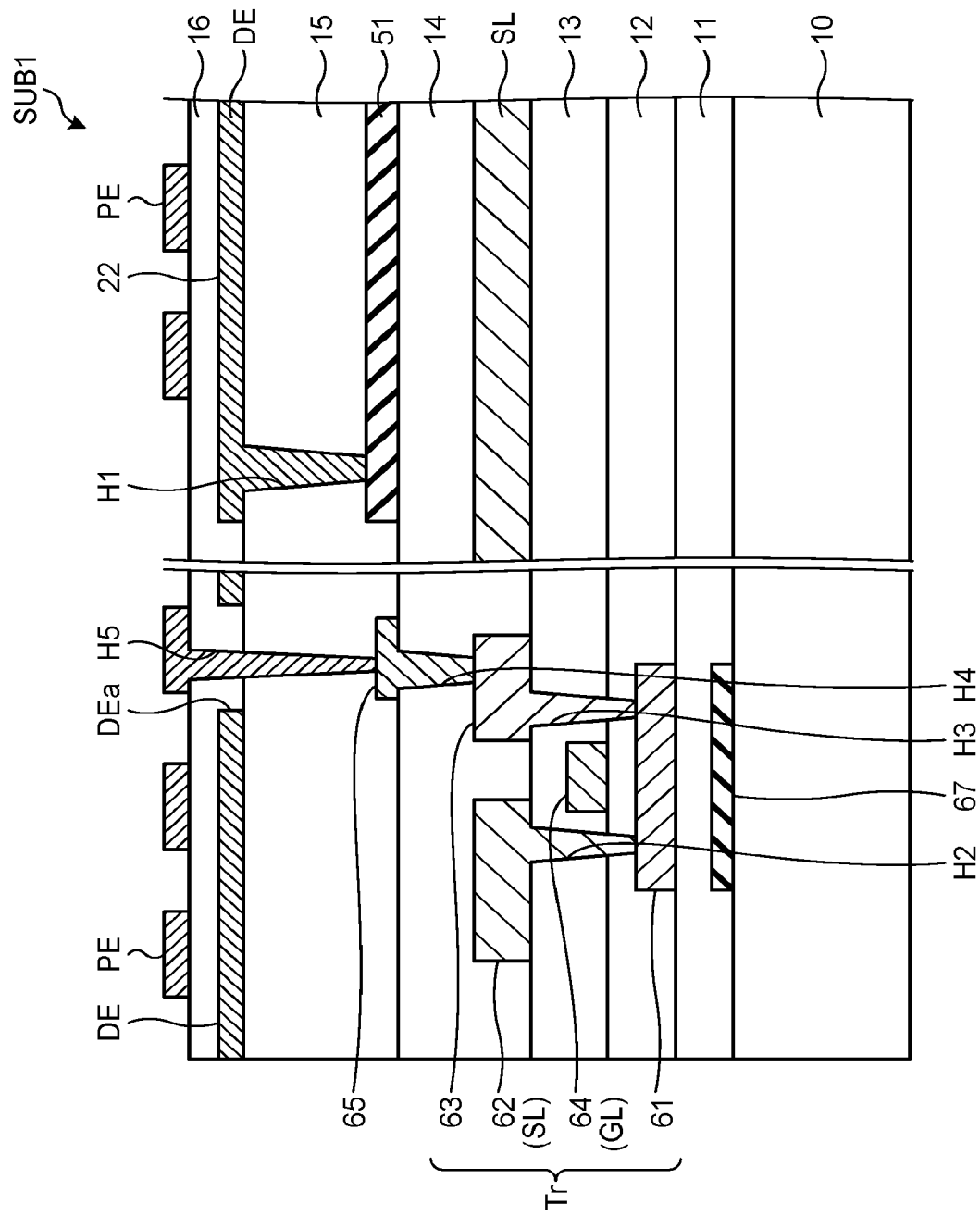
FIG. 6 is a sectional view along line VI-VI' in FIG. 5.

FIG. 5 is a plan view schematically illustrating the array substrate. FIG. 6 is a sectional view along line VI-VI' in FIG. 5. FIG. 6 also schematically illustrates the multilayered structure of the switching element Tr included in the sub-pixel SPX. The display region DA that displays an image includes a sensor region included in a detection device that detects capacitance. As illustrated in FIG. 5, a plurality of detection electrodes DE are arrayed in a matrix (row-column configuration) in the first direction Dx and the second direction Dy in the display region DA. The detection electrodes DE are separated by the slits SPA in the first direction Dx and the second direction Dy. Each detection electrodes DE is schematically illustrated in a rectangular or square shape in planar view. The shape of the detection electrode DE is not limited thereto and may be a polygonal shape, a parallelogrammatic shape, or an irregular shape having a cut-out, for example. The detection electrodes DE are made of a translucent conductive material, such as ITO.

The display device 1 further includes the signal line coupling circuit 30, a wiring region LA including a plurality of wires 53, and gate drivers 18. The signal line coupling circuit 30 and the wiring region LA are provided in the first partial peripheral region sBE1 of the first insulating substrate 10. The terminals T1, the wiring region LA (wires 53), the signal line coupling circuit 30, and the signal lines SL are coupled in this order from the first side 10s1 to the display region DA. One of the gate drivers 18 is provided in the third partial peripheral region sBE3, and the other is provided in the fourth partial peripheral region sBE4. The gate driver 18 may be provided in only one of the third partial peripheral region sBE3 and the fourth partial peripheral region sBE4.

The sensor wires 51 are electrically coupled to the respective detection electrodes DE and pulled out to the peripheral region BE. The sensor wires 51 extend along the second direction Dy and are disposed side by side in the first direction Dx. In each of the sensor wires 51, one end is coupled to the detection electrode DE, and the other end is electrically coupled to the signal line coupling circuit 30. The other ends of the sensor wires 51 are coupled to the terminals T1 through the signal line coupling circuit 30 and the wires 53. In this manner, the detection electrodes DE are electrically coupled to the driver IC 110 (refer to FIG. 1).

To perform display, the driver IC 110 supplies display drive signals to the sensor wires 51 through the wires 53. In the display operation, the detection electrodes DE are supplied with the display drive signals to serve as common electrodes for a plurality of pixel electrodes PE. To perform touch detection, the driver IC 110 supplies detection touch drive signals to the detection electrodes DE through the sensor wires 51. As a result, detection signals corresponding to capacitance changes in the detection electrodes DE are supplied to the detection circuit of the driver IC 110 through the wires 53. Consequently, the display device 1 can detect a target object in a contact state or a proximity state for each of the detection electrodes DE.

The pixel electrodes PE (refer to FIG. 3) are electrically coupled to the driver IC 110 through the signal lines SL and the signal line coupling circuit 30. The signal lines SL are electrically coupled to the respective pixel electrodes PE disposed side by side in the first direction Dx and are pulled out to the peripheral region BE. The signal lines SL extend along the second direction Dy and are disposed side by side in the first direction Dx. To simplify the drawing, FIG. 5 illustrates only part of the signal lines SL and the sensor wires 51.

The signal line coupling circuit 30 is provided along the boundary between the display region DA and the first partial peripheral region sBE1 and along curved parts DAc of the display region DA. The edges of the gate drivers 18 on the first partial peripheral region sBE1 side are provided side by side with the respective curved parts DAc in the first direction Dx. Parts of the signal line coupling circuit 30 formed along the respective curved parts DAc are each provided between the gate driver 18 and the curved part DAc in the first direction Dx. The signal lines SL and the sensor wires 51 are coupled to the signal line coupling circuit 30. The signal line coupling circuit 30 is electrically coupled to the wiring substrate 101 (refer to FIG. 1) through the wires 53 and the terminals T1 provided in the wiring region LA. The signal line coupling circuit 30 switches coupling and decoupling between the signal lines SL and the wires 53. The signal line coupling circuit 30 also switches coupling and decoupling between the sensor wires 51 and the wires 53.

As illustrated in FIG. 6, the switching element Tr includes a semiconductor 61, a source electrode 62, a drain electrode 63, and a gate electrode 64. The semiconductor 61 is provided above the first insulating substrate 10 with the first insulating film 11 interposed therebetween. A light-shielding layer 67 is provided between the first insulating substrate 10 and the semiconductor 61 in the direction perpendicular to the first insulating substrate 10.

The second insulating film 12 is provided on the first insulating film 11, covering the semiconductor 61. The gate electrode 64 is provided on the second insulating film 12. The gate electrode 64 is part of the scanning line GL overlapping the semiconductor 61. The third insulating film 13 is provided on the second insulating film 12, covering the gate electrode 64. A channel region is formed at part of the semiconductor 61 overlapping the gate electrode 64.

In the example illustrated in FIG. 6, the switching element Tr has what is called a top-gate structure. The switching element Tr may have a bottom-gate structure, in which the gate electrode 64 is provided under the semiconductor 61. Alternatively, the switching element Tr may have a dual-gate structure, in which the gate electrodes 64 sandwich the semiconductor 61 in the direction perpendicular to the first insulating substrate 10.

The source electrode 62 and the drain electrode 63 are provided on the third insulating film 13. The source electrode 62 according to the present embodiment is electrically coupled to the semiconductor 61 through a contact hole H2. The drain electrode 63 is electrically coupled to the semiconductor 61 through a contact hole H3. The source electrode 62 is part of the signal line SL overlapping the semiconductor 61.

The fourth insulating film 14 and the fifth insulating film 15 are provided above the third insulating film 13, covering the source electrode 62 and the drain electrode 63. A relay electrode 65 and the sensor wire 51 are provided on the fourth insulating film 14. The relay electrode 65 is electrically coupled to the drain electrode 63 through a contact hole H4. The sensor wire 51 is provided above the signal line SL. The sensor wire 51 overlaps the signal line SL in planar view and extends in parallel with the signal line SL. The detection electrode DE is provided on the fifth insulating film 15. The detection electrode DE is electrically coupled to the sensor wire 51 through a contact hole H1.

The pixel electrode PE is electrically coupled to the relay electrode 65 through a contact hole H5 formed in the sixth insulating film 16 and the fifth insulating film 15. The contact hole H5 is formed corresponding to an opening DEa of the detection electrode DE. With this configuration, the pixel electrode PE is coupled to the switching element Tr.

Figure 7:
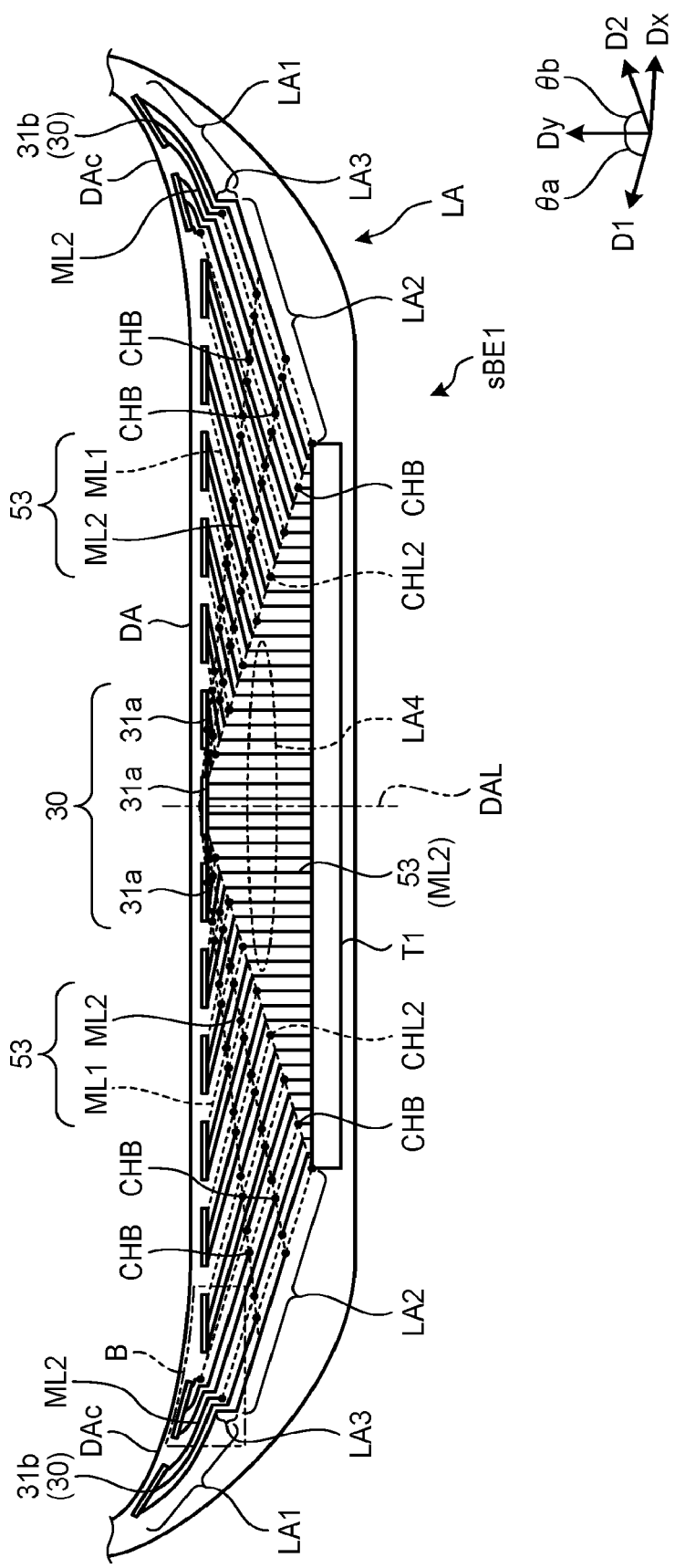
FIG. 7 is a plan view of a wiring region.
Figure 8:
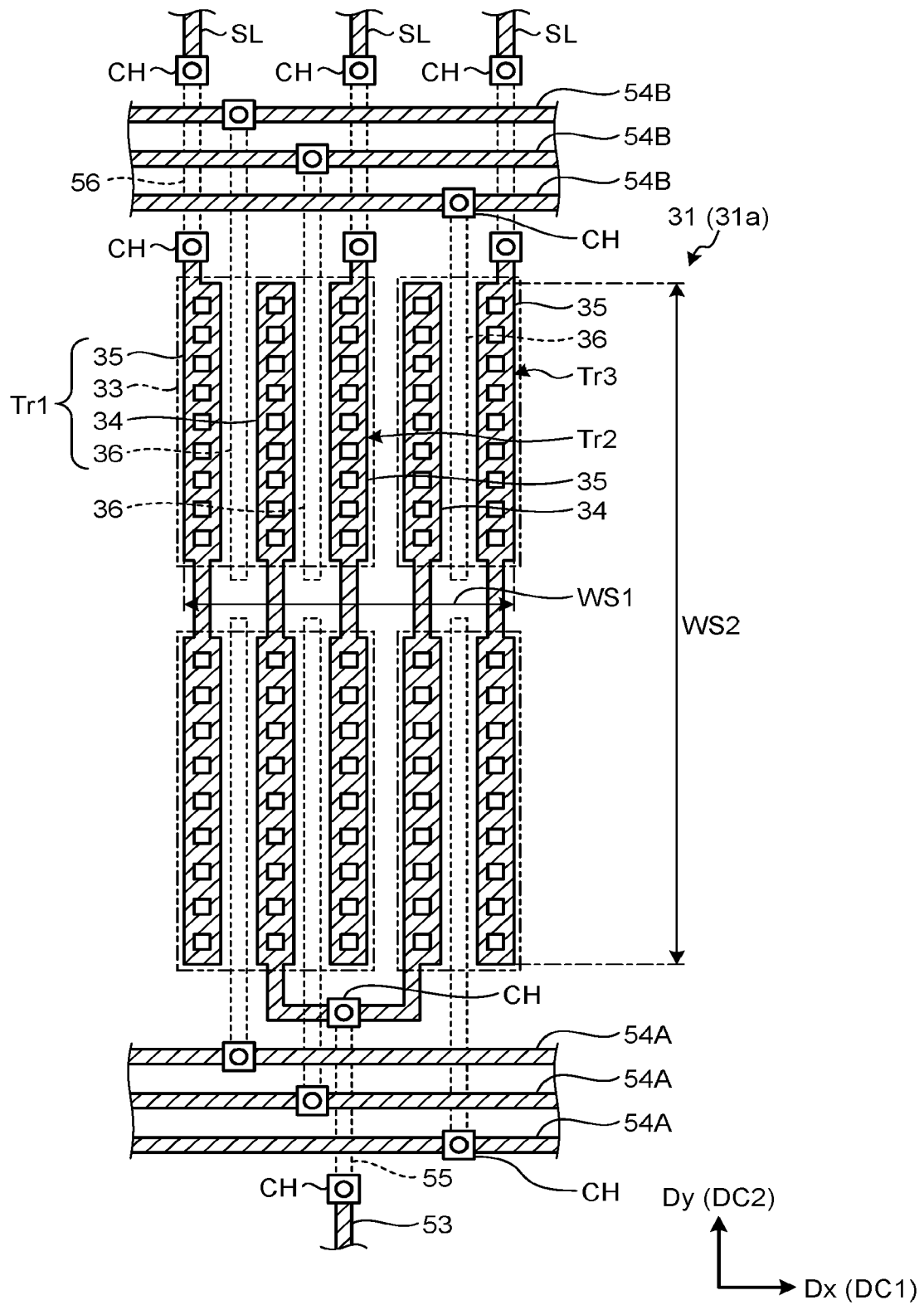
FIG. 8 is a plan view of a switching circuit.

The following describes the configuration of the wiring region LA in greater detail. FIG. 7 is a plan view of the wiring region. FIG. 8 is a plan view of a switching circuit. As illustrated in FIG. 7, a region between the terminals T1 and the signal line coupling circuit 30 is the wiring region LA according to the present embodiment. The signal line coupling circuit 30 includes a plurality of first switching circuits 31a and a plurality of second switching circuits 31b. The first switching circuits 31a are disposed along the linear part of the display region DA. The second switching circuits 31b are disposed along the curved parts DAc of the display region DA. In the following description, the first switching circuits 31a and the second switching circuits 31b may be simply referred to as switching circuits 31 when they need not be distinguished from each other.

As illustrated in FIG. 8, the switching circuits 31 each include a plurality of transistors, i.e., a transistor Tr1, a transistor Tr2, and a transistor Tr3. The transistors Tr1, Tr2, and Tr3 each include a semiconductor 33, a source electrode 34, a drain electrode 35, and a gate electrode 36. A direction in which a plurality of gate electrodes 36, a plurality of source electrodes 34, and a plurality of drain electrodes 35 are arrayed is referred to as a first circuit direction DC1. A direction orthogonal to the first circuit direction DC1 is referred to as a second circuit direction DC2. The second circuit direction DC2 is the direction in which the gate electrodes 36, the source electrodes 34, and the drain electrodes 35 extend. The first circuit direction DC1 of the first switching circuit 31a coincides with the first direction Dx. The second circuit direction DC2 of the first switching circuit 31a coincides with the second direction Dy.

The gate electrodes 36 are each coupled to a switching signal supply wire 54A or a switching signal supply wire 54B. The switching signal supply wires 54A and 54B supply the respective gate electrodes 36 with switching signals for controlling the corresponding transistors Tr1, Tr2, and Tr3. The switching signal supply wires 54A and 54B extend along the array direction (first circuit direction DC1) of the first switching circuits 31a and the second switching circuits 31b. The switching circuits 31 are disposed between the switching signal supply wires 54A and the switching signal supply wires 54B.

A plurality of source electrodes 34 are coupled to the wire 53 through a bridge wire 55. The bridge wire 55 is provided in a layer different from that of the switching signal supply wires 54A through contacts CH and intersects the switching signal supply wires 54A in planar view. In the configuration according to the present embodiment, the source electrode 34 of the transistor Tr1 is also used as the source electrode 34 of the transistor Tr2.

The drain electrodes 35 of the transistors Tr1, Tr2, and Tr3 are each coupled to the corresponding signal line SL through a bridge wire 56. The bridge wire 56 is provided in a layer different from that of the switching signal supply wires 54B through the contacts CH and intersects the switching signal supply wires 54B in planar view. Turning on and off the transistors Tr1, Tr2, and Tr3 is controlled based on the switching signals, whereby the signal lines SL are sequentially selected. Video signals from the wire 53 are supplied to the selected signal line SL.

The description on the first switching circuit 31a with reference to FIG. 8 can be applied to the second switching circuit 31b. The shape of the second switching circuit 31b in planar view and the first circuit direction DC1 and the second circuit direction DC2 thereof are different from those of the first switching circuit 31a. While the switching circuit 31 described above switches coupling and decoupling between one wire 53 and three signal lines SL, the present embodiment is not limited thereto. Four or more signal lines SL may be coupled to one switching circuit 31. The transistors Tr1, Tr2, and Tr3 may be provided in the layer identical to that of the switching element Tr (refer to FIG. 6) included in the pixel PX (sub-pixel SPX) or a layer different from that of the switching element Tr.

As illustrated in FIG. 7, the wiring region LA has first wiring regions LA1, second wiring regions LA2, third wiring regions LA3, and a fourth wiring region LA4. The first wiring regions LA1, the second wiring regions LA2, the third wiring regions LA3, and the fourth wiring region LA4 are line-symmetric with respect to a center line DAL. The center line DAL passes through the middle point of the display region DA in the first direction Dx and is parallel to the second direction Dy.

Two first wiring regions LA1 are disposed at outer parts of the wiring region LA in the first direction Dx, that is, at positions away from the terminals T1 in the first direction Dx. Two second wiring regions LA2, two third wiring regions LA3, and one fourth wiring region LA4 are disposed between the two first wiring regions LA1.

The first wiring regions LA1 are each provided side by side with the curved part DAc of the display region DA. A plurality of wires 53 included in the first wiring region LA1 are formed of a second metal layer ML2 and electrically coupled to the signal lines SL through the second switching circuits 31b.

The second wiring regions LA2 are each provided between the first wiring region LA1 and the terminals T1. In the second wiring region LA2 provided on the left side with respect to the center line DAL, the wires 53 extend in a first direction D1. The first direction D1 is a direction forming an inclination angle θa with the second direction Dy. In the second wiring region LA2 provided on the right side with respect to the center line DAL, the wires 53 extend in a second direction D2 toward the opposite direction of the first direction D1 with respect to the second direction Dy. The second direction D2 is a direction forming an inclination angle θb with the second direction Dy. The inclination angle θa and the inclination angle θb are identical, but they may differ from each other. At least one or more wires 53 out of the wires 53 in the second wiring region LA2 pass through a first metal layer ML1 and the second metal layer ML2 through the contacts CH.

The third wiring regions LA3 are each provided between the first wiring region LA1 and the second wiring region LA2. The wires 53 in the third wiring region LA3 extend in the second direction Dy and couple the first wiring region LA1 and the second wiring region LA2. A plurality of wires 53 in the second wiring region LA2 not coupled to the third wiring region LA3 are coupled to the first switching circuits 31a.

The fourth wiring region LA4 is a region for coupling the wires 53 to the respective terminals T1 and provided between the second wiring regions LA2 and the terminals T1. The wires 53 in the fourth wiring region LA4 extend from the terminals T1 in the second direction Dy and are coupled to the second wiring regions LA2. In the fourth wiring region LA4, the length of the wire 53 decreases with distance from the center line DAL. The wires 53 included in the fourth wiring region LA4 are formed of the second metal layer ML2.

Figure 9:
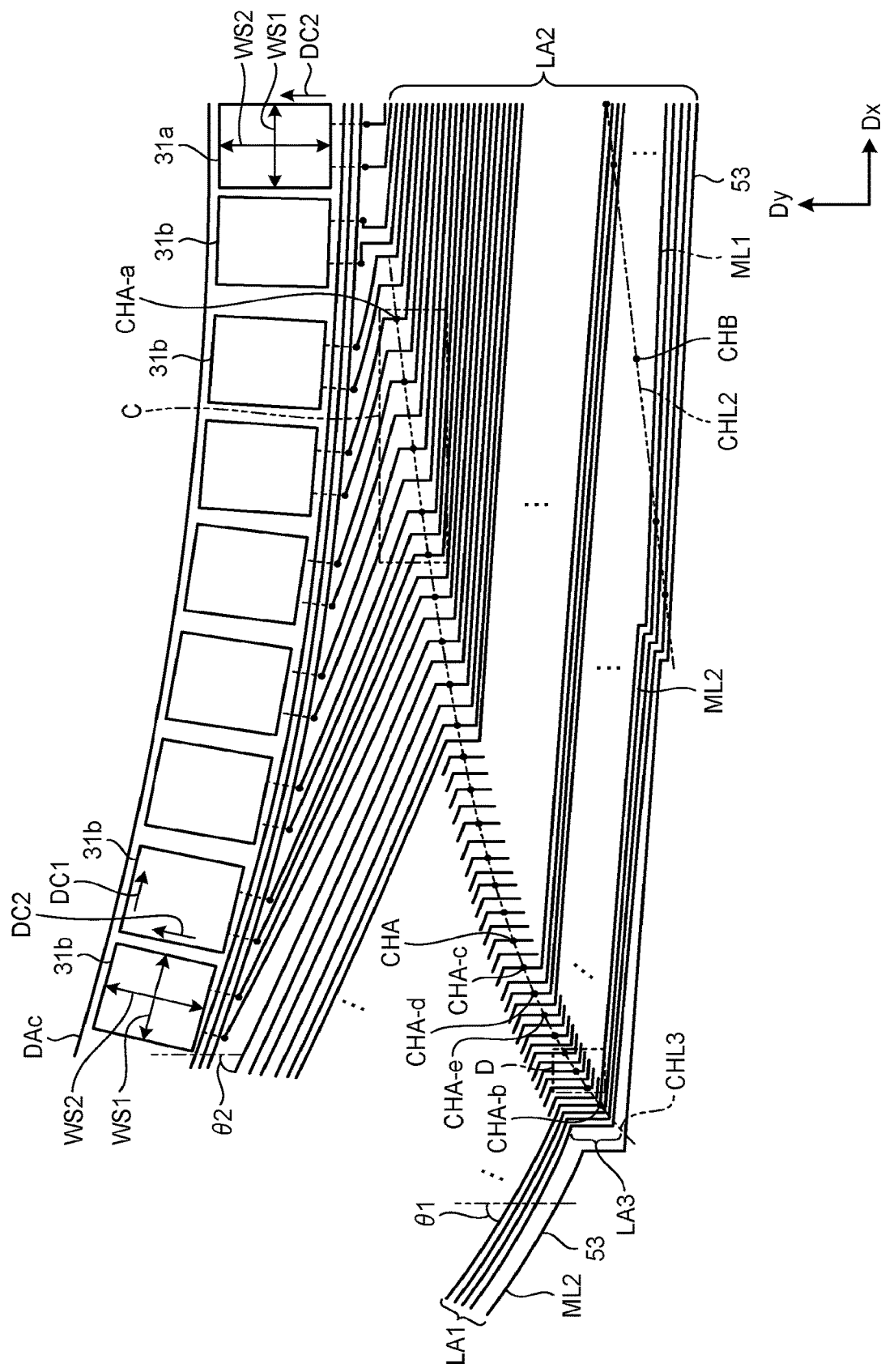
FIG. 9 is an enlarged plan view of a region B in FIG. 7.
Figure 10:
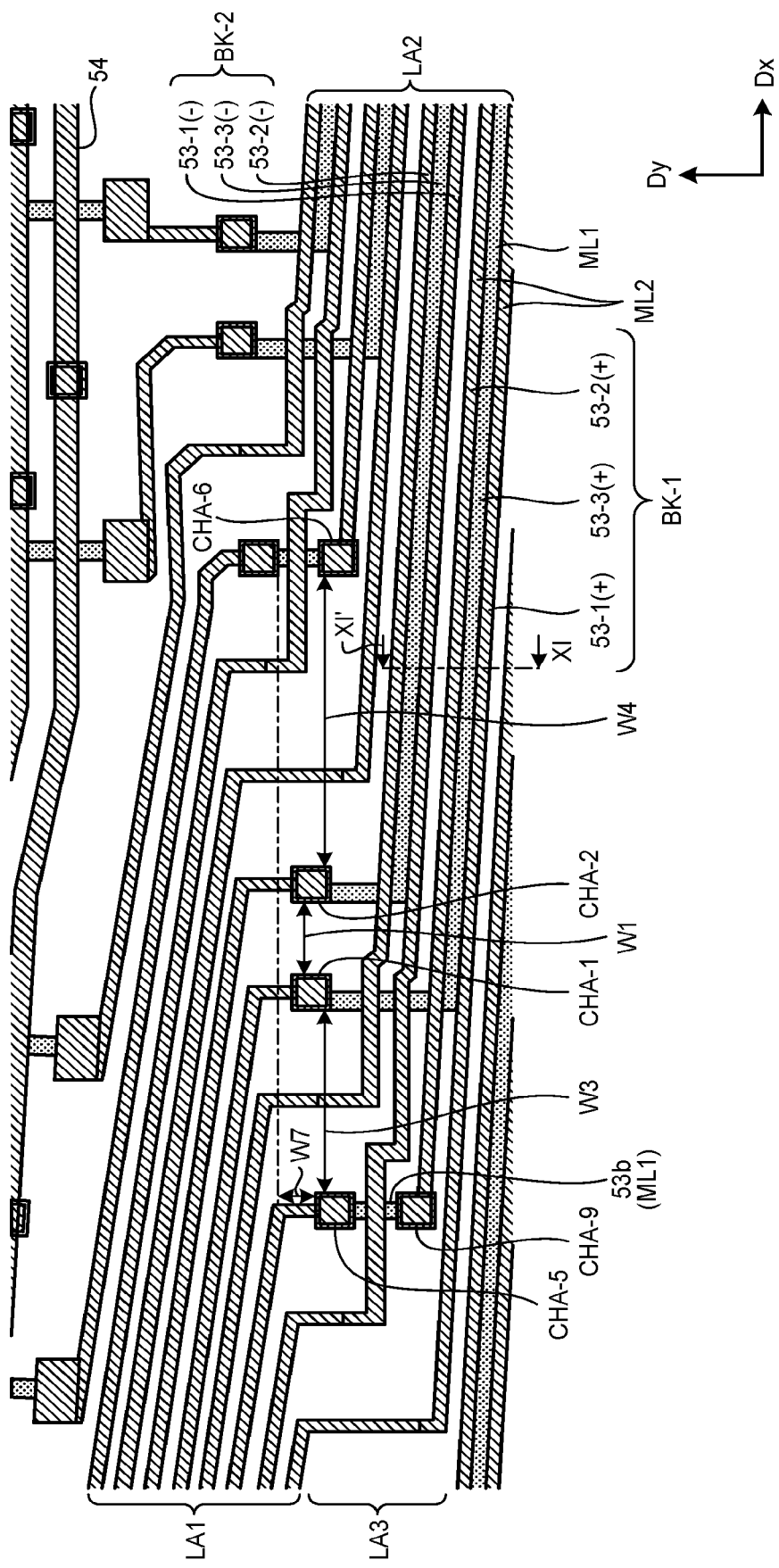
FIG. 10 is an enlarged plan view of a region C in FIG. 9.
Figure 11:
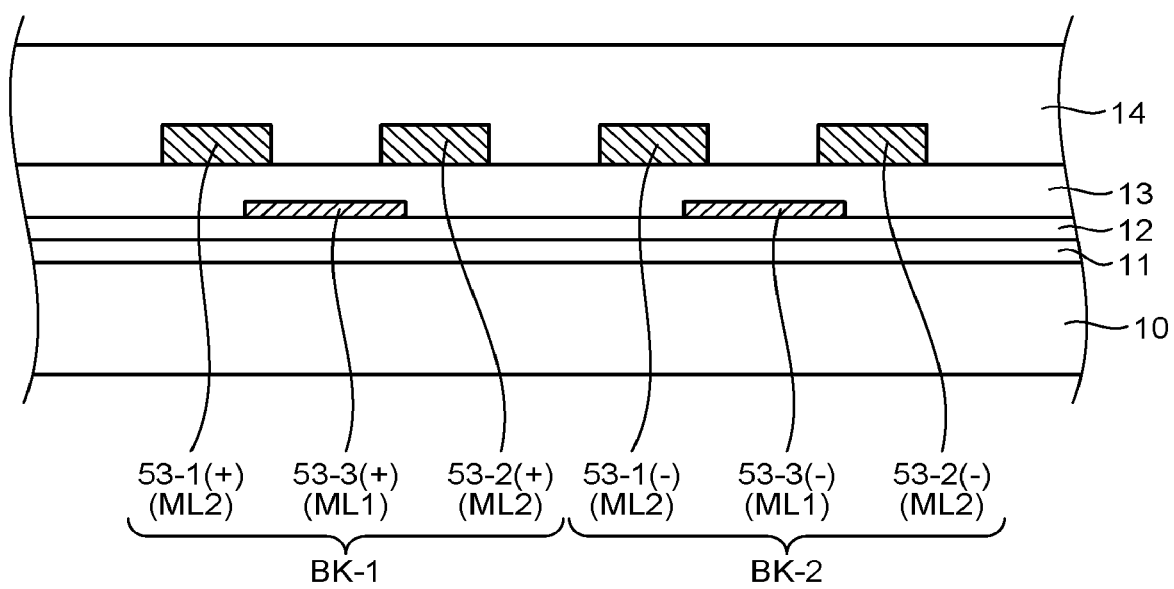
FIG. 11 is a sectional view along line XI-XI' in FIG. 10.
Figure 12:
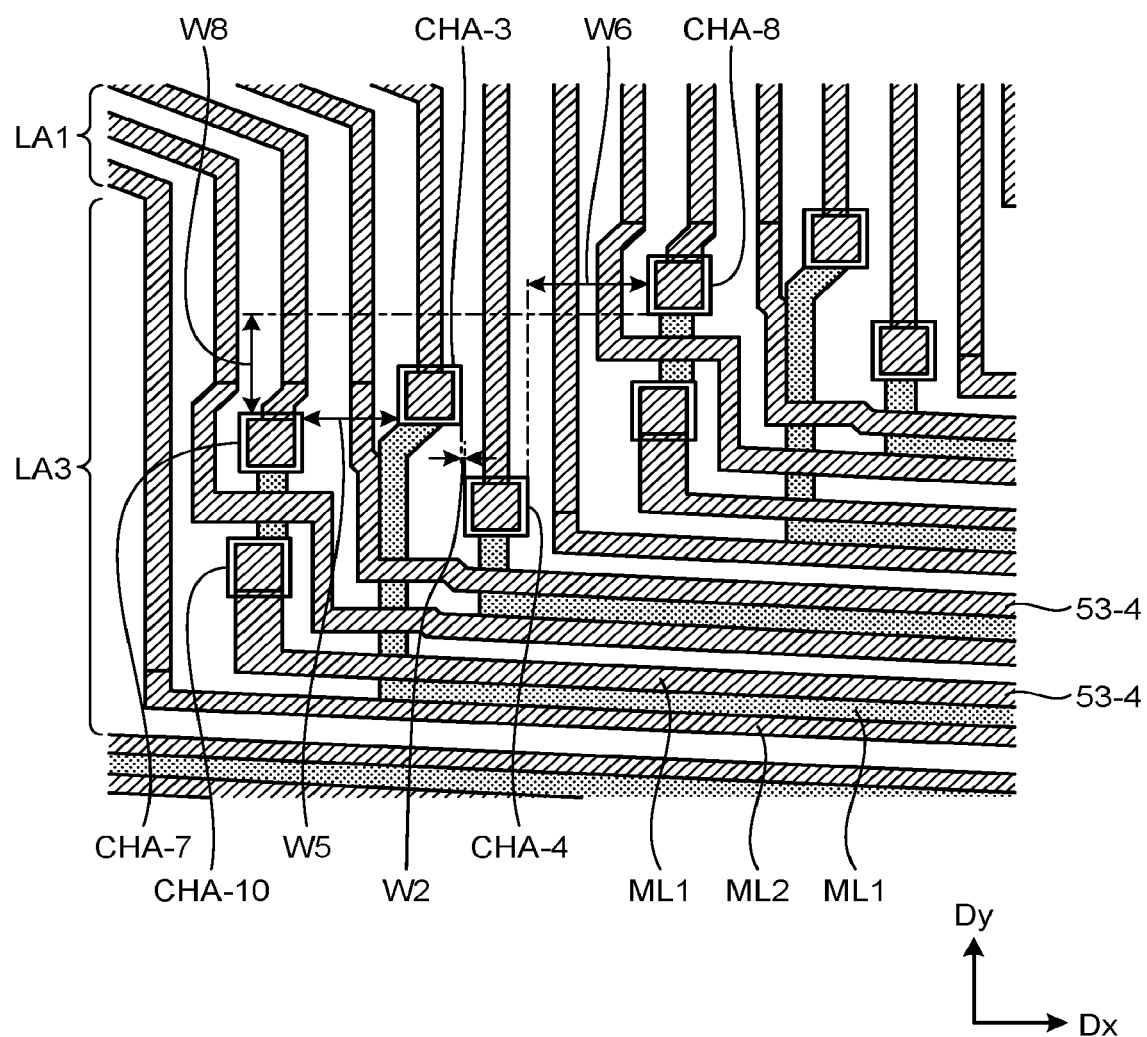
FIG. 12 is an enlarged plan view of a region D in FIG. 9.

FIG. 9 is an enlarged plan view of a region B in FIG. 7. FIG. 10 is an enlarged plan view of a region C in FIG. 9. FIG. 11 is a sectional view along line XI-XI' in FIG. 10. FIG. 12 is an enlarged plan view of a region D in FIG. 9.

As illustrated in FIG. 10, the wires 53 in the second wiring region LA2 have the first metal layers ML1 and the second metal layers ML2 provided in different layers. As illustrated in FIG. 11, the first metal layers ML1 are provided on the second insulating film 12. That is, the first metal layers ML1 are wiring layers identical to those of the scanning lines GL (refer to FIG. 6) and made of a material identical to that of the scanning lines GL. The second metal layers ML2 are provided on the third insulating film 13. That is, the second metal layers ML2 are wiring layers identical to those of the signal lines SL (refer to FIG. 6) and made of a material identical to as that of the signal lines SL. The terminals T1 are also formed of the second metal layers ML2.

As illustrated in FIG. 10, the wires 53 include first wires 53-1, second wires 53-2, and third wires 53-3. The wires 53 include a plurality of wires 53 that supply positive-polarity (+) video signals and a plurality of wires 53 that supply negative-polarity (−) video signals. The wires 53 having positive polarity (+) and the wires 3 having negative polarity (−) are alternately arrayed at at least a part coupled to the signal line coupling circuit 30 and a part coupled to the terminals T1. In the following description, the wires 53 are distinguished from one another like a first wire 53-1(+) and a first wire 53-1(−) in FIGS. 10 and 11. The signs (+) and (−) may be omitted in some cases where the positive polarity (+) and the negative polarity (−) need not be distinguished.

The positive-polarity video signal and the negative-polarity video signal are voltage signals having different polarities based on the electric potential of the display drive signal. The display device 1 performs driving by application of an alternating current, i.e., alternate application of a positive-polarity voltage and a negative-polarity voltage. This mechanism can suppress reduction in the life of the display device 1 due to deviation of positive and negative charges in the pixel electrodes PE.

In the second wiring region LA2, the wires 53 are collectively disposed in a positive-polarity wiring block BK-1 and a negative-polarity wiring block BK-2. The positive-polarity wiring block BK-1 includes the first wire 53-1(+), the second wire 53-2(+), and the third wire 53-3(+). The negative-polarity wiring block BK-2 includes the first wire 53-1(−), the second wire 53-2(−), and the third wire 53-3(−). The positive-polarity wiring block BK-1 and the negative-polarity wiring block BK-2 each include three wires 53 with the identical polarity disposed side by side. Consequently, the display device 1 can have smaller stray capacitance between the wires 53.

As illustrated in FIG. 10, in the positive-polarity wiring block BK-1, the third wire 53-3(+) is disposed between the first wire 53-1(+) and the second wire 53-2(+) in planar view. The third wire 53-3(+) is formed of the first metal layer ML1. The first wire 53-1(+) and the second wire 53-2(+) are formed of the second metal layer ML2. The wires in the negative-polarity wiring block BK-2 have the identical configuration.

As illustrated in FIG. 11, the wires 53 partially overlap each other in planar view. The width of the third wire 53-3(+), for example, is larger than the space between the first wire 53-1(+) and the second wire 53-2(+). The width of the third wire 53-3(−) is larger than the space between the first wire 53-1(−) and the second wire 53-2(−).

With this configuration, the arrangement pitch of the wires 53 in the second wiring region LA2 can be made smaller than that in the other wiring regions. In the second wiring region LA2, a space may be formed between the wires 53 in planar view.

As illustrated in FIG. 9, the second wiring region LA2 has contacts CHB, each of which couples the first metal layer ML1 and the second metal layer ML2. The sheet resistance of the first metal layer ML1 is larger than that of the second metal layer ML2. The contacts CHB are provided at such positions that divide the length of the wires 53 into three equal parts in the second wiring region LA2. That is, the first wire 53-1, the second wire 53-2, and the third wire 53-3 have an equal total length of the first metal layers ML1 and an equal total length of the second wiring layers ML2. This configuration reduces the difference in resistance between the first wire 53-1, the second wire 53-2, and the third wire 53-3, thereby suppressing deterioration in display performance of the display device 1.

As illustrated in FIG. 9, in the third wiring region LA3, the arrangement pitch of the wires 53 in the first direction Dx decreases with distance from the display region DA. In other words, the arrangement pitch of the wires 53 in the first direction Dx decreases with distance from the center line DAL (refer to FIG. 7). In the third wiring region LA3, the length of the wire 53 extending in the second direction Dy increases with distance from the display region DA.

At least part of the wires 53 in the third wiring region LA3 has a plurality of contacts CHA that couple the first metal layer ML1 and the second metal layer ML2. The contacts CHA each couple the wire 53 formed of the first metal layer ML1 to the second metal layer ML2 in the second wiring region LA2. The contacts CHA are disposed such that a virtual line CHL3 connecting the contacts CHA has a curved shape. That is, the distance between the contact CHA and the display region DA in the second direction Dy increases with distance from the center line DAL (refer to FIG. 7).

The arrangement pitch of the contacts CHA in the first direction Dx decreases with distance from the display region DA, i.e., with distance from the center line DAL (refer to FIG. 7). The arrangement pitch of the contacts CHA in the second direction Dy increases with distance from the display region DA, i.e., with distance from the center line DAL (refer to FIG. 7). The virtual line CHL3 has a curvature larger than that of a virtual line CHL2 connecting the contacts CHB included in the second wiring region LA2. While the virtual line CHL2 in the second wiring region LA2 has a linear shape in FIGS. 7 and 9, the contacts CHB may be disposed such that the virtual line CHL2 has a curved shape.

Specifically, as illustrated in FIG. 10, the third wiring region LA3 in a region (region C illustrated in FIG. 9) closer to the display region DA has a first contact CHA-1 and a second contact CHA-2 disposed side by side in the first direction Dx. The first contact CHA-1 is provided on the third wire 53-3(+), and the second contact CHA-2 is provided on the third wire 53-3(−). The first contact CHA-1 couples the third wire 53-3(+) formed of the first metal layer ML1 and the third wire 53-3(+) formed of the second metal layer ML2. The second contact CHA-2 couples the third wire 53-3(−) formed of the first metal layer ML1 and the third wire 53-3(−) formed of the second metal layer ML2. No wire 53 is provided between the first contact CHA-1 and the second contact CHA-2. A distance between the first contact CHA-1 and the second contact CHA-2 in the first direction Dx is referred to as a first distance W1.

As illustrated in FIG. 9, the region D is farther away from the display region DA than the region C is from the display region DA in the second direction Dy. As illustrated in FIG. 12, the third wiring region LA3 in a region (e.g., the region D illustrated in FIG. 9) farther away from the display region DA has a third contact CHA-3 and a fourth contact CHA-4 disposed side by side in the first direction Dx. No other wire 53 is provided between the third contact CHA-3 and the fourth contact CHA-4. A distance between the third contact CHA-3 and the fourth contact CHA-4 in the first direction Dx is referred to as a second distance W2. The first distance W1 illustrated in FIG. 10 is larger than the second distance W2 illustrated in FIG. 12.

Similarly, as illustrated in FIG. 10, a fifth contact CHA-5 is disposed side by side with the first contact CHA-1 in the first direction Dx with the wire 53 (second wire 53-2(−)) interposed therebetween. A ninth contact CHA-9 is disposed side by side with the fifth contact CHA-5 in the second direction Dy. The fifth contact CHA-5 and the ninth contact CHA-9 are provided on the second wire 53-2(+). The first wire 53-1(−) is provided between the fifth contact CHA-5 and the ninth contact CHA-9 and intersects the second wire 53-2(+).

A sixth contact CHA-6 is disposed side by side with the second contact CHA-2 in the first direction Dx with the wire 53 interposed therebetween. A distance between the first contact CHA-1 and the fifth contact CHA-5 in the first direction Dx is referred to as a third distance W3. A distance between the second contact CHA-2 and the sixth contact CHA-6 in the first direction Dx is referred to as a fourth distance W4.

As illustrated in FIG. 12, a seventh contact CHA-7 is disposed side by side with the third contact CHA-3 in the first direction Dx with the wire 53 (fourth wire 53-4) interposed therebetween. A tenth contact CHA-10 is disposed side by side with the seventh contact CHA-7 in the second direction Dy. The seventh contact CHA-7 and the tenth contact CHA-10 are provided on the fourth wire 53-4.

The wire 53 different from the fourth wire 53-4 is provided between the seventh contact CHA-7 and the tenth contact CHA-10 and intersects the fourth wire 53-4.

An eighth contact CHA-8 is disposed side by side with the fourth contact CHA-4 in the first direction Dx with the wire 53 interposed therebetween. A distance between the third contact CHA-3 and the seventh contact CHA-7 in the first direction Dx is referred to as a fifth distance W5. A distance between the fourth contact CHA-4 and the eighth contact CHA-8 in the first direction Dx is referred to as a sixth distance W6. Each of the third distance W3 and the fourth distance W4 illustrated in FIG. 10 is larger than the fifth distance W5 and the sixth distance W6 illustrated in FIG. 12.

As illustrated in FIG. 10, a distance between the fifth contact CHA-5 and the sixth contact CHA-6 in the second direction Dy is referred to as a seventh distance W7. As illustrated in FIG. 12, a distance between the seventh contact CHA-7 and the eighth contact CHA-8 in the second direction Dy is referred to as an eighth distance W8. Two contacts (the first contact CHA-1 and the second contact CHA-2) are disposed between the fifth contact CHA-5 and the sixth contact CHA-6. Similarly, two contacts (the third contact CHA-3 and the fourth contact CHA-4) are provided between the seventh contact CHA-7 and the eighth contact CHA-8. The seventh distance W7 is smaller than the eighth distance W8.

With the configuration where the wires 53 and the contacts CHA are provided in the third wiring region LA3 as described above, the wires 53 can be efficiently provided in the first wiring region LA1 positioned side by side with the curved part DAc and in the second wiring region LA2. Specifically, as illustrated in FIG. 9, an angle formed by the second direction Dy and the extending direction of the wires 53 provided farther away from the display region DA in the first wiring region LA1 is referred to as a first angle θ1. An angle formed by the second direction Dy and the extending direction of the wires 53 provided closer to the display region DA in the first wiring region LA1 is referred to as a second angle θ2. The first angle θ1 is smaller than the second angle θ2.

The virtual line CHL3 is a line connecting the contacts CHA. If the adjacent contacts CHA are connected by straight lines, for example, the virtual line CHL3 may possibly have a zigzag shape. Even in this case where the virtual line CHL3 connects the contacts CHA from the display region DA to the outer side (e.g., the first side 10s1) of the first insulating substrate 10 by straight lines, the virtual line CHL3 can be said to have a curved shape as a whole. In other words, the curved shape of the virtual line CHL3 is formed as follows: when a plurality of adjacent contacts CHA, that is, contacts CHA-c, CHA-d, and CHA-e illustrated in FIG. 9 are connected, for example, a straight line connecting the contacts CHA-c and CHA-d and a straight line connecting the contacts CHA-d and CHA-e extend in different directions. In addition, the curved shape of the virtual line CHL3 is formed as follows: when a virtual line is formed by connecting a contact CHA-a of the wire 53 positioned near the display region DA in the third wiring region LA3, a contact CHA-b of a plurality of wires 53 positioned near the outer side of the first insulating substrate 10, and a plurality of optionally selected contacts CHA positioned therebetween, the resultant virtual line has a substantially curved shape as a whole. The optionally selected contacts CHA are approximately 15 to 20 contacts CHA disposed between the contact CHA-a and the contact CHA-b in a balanced manner, for example. The number of the optionally selected contacts CHA is given by way of example only and may be 20 or more.

One or a plurality of other contacts CHA may be provided between the adjacent contacts CHA-c and CHA-d and between the adjacent contacts CHA-d and CHA-e.

The virtual line CHL3 has different curvatures between the region D and the region C illustrated in FIG. 9. In FIG. 9, the curvature of the virtual line CHL3 in the region D is larger than that of the virtual line CHL3 in the region C.

With this configuration, the present embodiment has a smaller arrangement pitch (arrangement density) of the wires 53 in the first wiring region LA1 than in a case where the wires 53 and the contacts CHA in the third wiring region LA3 are provided at equal intervals. Consequently, in the display device 1, the area of the peripheral region positioned in the extending direction of the signal lines SL can be reduced with respect to the display region DA.

The wires 53 in the second wiring region LA2 and the third wiring region LA3 are not necessarily formed of the first metal layer ML1 and the second metal layer ML2. The wires 53 in the second wiring region LA2 and the third wiring region LA3, for example, may include a third metal layer formed in a layer different from the first metal layer ML1 and the second metal layer ML2. The third metal layer is provided in the layer identical to that of the sensor wires 51 (refer to FIGS. 3 and 6). The wires 53 in the first wiring region LA1 are not necessarily formed of the second metal layer ML2 and may include the third metal layer.

As illustrated in FIG. 9, the first switching circuits 31a and the second switching circuits 31b have different shapes in planar view. The first switching circuits 31a are disposed side by side with the linear part of the display region DA. The second switching circuits 31b are disposed side by side with the curved part DAc of the display region DA.

Specifically, as illustrated in FIG. 9, the second switching circuits 31b are disposed such that their first circuit directions DC1 extend along the curved part DAc and that their second circuit directions DC2 are different from one another. The angle formed by the second direction Dy and the second circuit direction DC2 of the second switching circuit 31b increases with distance from the center line DAL (refer to FIG. 7). The angle formed by the second direction Dy and the second circuit direction DC2 of the second switching circuit 31b is larger than that formed by the second direction Dy and the second circuit direction DC2 of the first switching circuit 31a.

As illustrated in FIG. 8, a first width WS1 is the length of the switching circuit 31 in the first circuit direction DC1, and a second width WS2 is the length thereof in the second circuit direction DC2. As illustrated in FIG. 9, the first width WS1 of the second switching circuit 31b is larger than that of the first switching circuit 31a. The second width WS2 of the second switching circuit 31b is smaller than that of the first switching circuit 31a. The first width WS1 of the second switching circuit 31b increases with distance from the center line DAL (refer to FIG. 7). The second width WS2 of the second switching circuit 31b decreases with distance from the center line DAL (refer to FIG. 7). With this configuration, the switching circuits 31 can be efficiently disposed.

FIG. 13 is a plan view illustrating arrangement of the switching circuits, transfer circuits, and the scanning lines. To simplify the drawing, FIG. 13 does not illustrate the signal lines SL and the wires 53. The second switching circuits 31b are arrayed along the curved part DAc. A plurality of transfer circuits 19 included in the gate driver 18 are disposed between the edge of the first insulating substrate 10 and the second switching circuits 31*b*. The transfer circuits 19 are coupled to the scanning lines GL through scanning line coupling wires GCL. The scanning lines GL (scanning line coupling wires GCL) intersecting the curved part DAc pass between the second switching circuits 31*b* disposed side by side and are coupled to the transfer circuits 19.

The transfer circuit 19 performs a shift operation by temporarily holding an input shift signal and sequentially transmitting the shift signal to the next stage in synchronization with a clock signal. Besides performing the shift operation, the transfer circuit 19 supplies an output signal (scanning signal) to the corresponding scanning line GL when holding the shift signal. By the shift operations performed by the transfer circuits 19, the scanning signals are sequentially supplied to the scanning lines GL, and video signals are sequentially written to the sub-pixels SPX supplied with the scanning signals. Because the specific configuration of the transfer circuit 19 is described in JP-A-2016-148751, the description thereof is omitted herein by specifying JP-A-2016-148751 in the present embodiment.

The space between the second switching circuits 31*b* disposed side by side increases with distance from the center line DAL (refer to FIG. 7) in the first direction Dx, that is, the space increases as it becomes closer to the third side 10*s*3 of the first insulating substrate 10. As illustrated in FIG. 13, the space between second switching circuits 31*b*-3 and 31*b*-4 disposed side by side, out of the second switching circuits 31*b*, is larger than that between second switching circuits 31*b*-2 and 31*b*-1 disposed side by side. One scanning line coupling wire GCL is provided between the second switching circuits 31*b*-2 and 31*b*-1 disposed side by side. Two scanning line coupling wires GCL are provided between the second switching circuits 31*b*-3 and 31*b*-4 disposed side by side.

The space between second switching circuits 31*b*-5 and 31*b*-6 disposed side by side, out of the second switching circuits 31*b*, is larger than that between the second switching circuits 31*b*-3 and 31*b*-4 disposed side by side. Three scanning line coupling wires GCL are provided between the second switching circuits 31*b*-5 and 31*b*-6 disposed by side.

Second switching circuits 31*b*-7 and 31*b*-8 provided at the edge out of the second switching circuits 31*b* are disposed in different directions. The second switching circuit 31*b*-7 is disposed such that its second circuit direction DC2 (refer to FIG. 9) is orthogonal to the curved part DAc. The second switching circuit 31*b*-8 closest to the third side 10*s*3 is disposed with its second circuit direction DC2 extending in a direction parallel to the second direction Dy.

With this configuration, the second switching circuits 31*b*, the transfer circuits 19, the scanning line coupling wires GCL, and the wires 53 (not illustrated in FIG. 13) can be efficiently disposed in the display device 1. Consequently, in the display device 1, the area of the peripheral region BE between the curved part DAc and the edge of the first insulating substrate 10 can be reduced.

While the exemplary embodiments have been described, the embodiments are not intended to limit the present disclosure. The contents disclosed in the embodiments are given by way of example only, and various changes may be made without departing from the spirit of the present disclosure. Appropriate changes made without departing from the spirit of the present disclosure naturally fall within the scope of the disclosure. The components can be variously omitted, replaced, and modified without departing from the gist of the embodiments described above.

What is claimed is:

1. A display device, comprising:
   a substrate;
   a display region provided with a plurality of pixels;
   a peripheral region positioned between an edge of the substrate and the display region;
   a plurality of signal lines, each of which is coupled to switching elements provided to the respective pixels, and that are arrayed in a first direction;
   a plurality of terminals arrayed in the first direction in the peripheral region of the substrate;
   a plurality of wires, each of which couples one of the terminals and at least one of the signal lines in the peripheral region;
   a first metal layer and a second metal layer provided in different layers in a direction perpendicular to the substrate in the peripheral region; and
   an insulating film provided between the first metal layer and the second metal layer in the peripheral region,
   wherein
   the peripheral region includes:
      a first wiring region, in which each of the wires is formed in a layer different from the first metal layer and is electrically coupled to at least one of the signal lines;
      a second wiring region provided between the first wiring region and the terminals, and in which at least one or more of the wires pass through the first metal layer and the second metal layer; and
      a third wiring region provided between the first wiring region and the second wiring region, and in which the wires extend in a second direction intersecting the first direction,
   the third wiring region includes a plurality of contacts, each of which couples the first metal layer and the second metal layer, and a virtual line connecting the contacts has a curved shape,
   the contacts in the third wiring region include:
      a first contact and a second contact disposed side by side in the first direction, and
      a third contact and a fourth contact disposed side by side in the first direction, the third contact and the fourth contact provided farther away from the display region than the first contact and the second contact in the second direction, and
   a distance between the first contact and the second contact in the first direction is larger than a distance between the third contact and the fourth contact in the first direction.

2. A display device, comprising:
   a substrate;
   a display region provided with a plurality of pixels;
   a peripheral region positioned between an edge of the substrate and the display region;
   a plurality of signal lines, each of which is coupled to switching elements provided to the respective pixels, and that are arrayed in a first direction;
   a plurality of terminals arrayed in the first direction in the peripheral region of the substrate;
   a plurality of wires, each of which couples one of the terminals and at least one of the signal lines in the peripheral region;
   a first metal layer and a second metal layer provided in different layers in a direction perpendicular to the substrate in the peripheral region; and
   an insulating film provided between the first metal layer and the second metal layer in the peripheral region, wherein the peripheral region includes:
- a first wiring region, in which each of the wires is formed in a layer different from the first metal layer and is electrically coupled to at least one of the signal lines;
- a second wiring region provided between the first wiring region and the terminals, and in which at least one or more of the wires pass through the first metal layer and the second metal layer; and
- a third wiring region provided between the first wiring region and the second wiring region, and in which the wires extend in a second direction intersecting the first direction, the third wiring region includes a plurality of contacts, each of which couples the first metal layer and the second metal layer, and a virtual line connecting the contacts has a curved shape, and an arrangement pitch of the wires in the first direction in the third wiring region decreases with distance from the display region.

3. The display device according to claim 1, wherein a length of one of the wires extending in the second direction in the third wiring region increases with distance from the display region.

4. The display device according to claim 1, wherein in the first wiring region, a first angle formed by the second direction and an extending direction of the wires provided farther away from the display region is smaller than a second angle formed by the second direction and an extending direction of the wires provided closer to the display region.

5. The display device according to claim 1, wherein the second wiring region includes a plurality of contacts, each of which couples the first metal layer and the second metal layer, and the virtual line connecting the contacts in the third region has a curvature larger than a curvature of a virtual line connecting the contacts in the second wiring region.

6. A display device, comprising:

a substrate, a display region provided with a plurality of pixels;

a peripheral region positioned between an edge of the substrate and the display region;

a plurality of signal lines, each of which is coupled to switching elements provided to the respective pixels, and that are arrayed in a first direction;

a plurality of terminals arrayed in the first direction in the peripheral region of the substrate;

a plurality of wires, each of which couples one of the terminals and at least one of the signal lines in the peripheral region;

a first metal layer and a second metal layer provided in different layers in a direction perpendicular to the substrate in the peripheral region;

an insulating film provided between the first metal layer and the second metal layer in the peripheral region;

a plurality of switching circuits configured to switch coupling and decoupling between the wires and the signal lines; and a plurality of scanning lines each configured to supply a scanning signal to the switching elements, wherein the peripheral region includes:
- a first wiring region, in which each of the wires is formed in a layer different from the first metal layer and is electrically coupled to at least one of the signal lines;
- a second wiring region provided between the first wiring region and the terminals, and in which at least one or more of the wires pass through the first metal layer and the second metal layer; and
- a third wiring region provided between the first wiring region and the second wiring region, and in which the wires extend in a second direction intersecting the first direction, the third wiring region includes a plurality of contacts, each of which couples the first metal layer and the second metal layer, and a virtual line connecting the contacts has a curved shape, an outer periphery of the display region has a curved part in planar view, and the switching circuits include:
- a plurality of first switching circuits;
- a plurality of second switching circuits disposed side by side with the curved part, and each having a shape different from a shape of each of the first switching circuits in planar view, at least one of the scanning lines intersecting the curved part passes between two adjacent second switching circuits out of the second switching circuits, and is coupled to a transfer circuit.

7. The display device according to claim 6, wherein the switching circuits each include a gate electrode, a source electrode coupled to one of the wires, and a drain electrode coupled to one of the signal lines, and when a first width is a dimension in a first circuit direction, in which the gate electrode, the source electrode, and the drain electrode are arrayed, and a second width is a dimension in a second circuit direction, in which the gate electrode, the source electrode, and the drain electrode extend, the first width of each of the second switching circuits is larger than the first width of each of the first switching circuits.

8. The display device according to claim 7, wherein the second width of each of the second switching circuits is smaller than the second width of each of the first switching circuits.

9. The display device according to claim 7, wherein an angle formed by the second direction and the second circuit direction of each of the second switching circuits is larger than an angle formed by the second direction and the second circuit direction of each of the first switching circuits.

10. The display device according to claim 6, wherein a space between two adjacent second switching circuits out of the second switching circuits increases with distance from the first switching circuits in the first direction.

11. The display device according to claim 2, wherein a length of one of the wires extending in the second direction in the third wiring region increases with distance from the display region.

12. The display device according to claim 2, wherein in the first wiring region, a first angle formed by the second direction and an extending direction of the wires provided farther away from the display region is smaller than a second angle formed by the second direction and an extending direction of the wires provided closer to the display region.

13. The display device according to claim 2, wherein
the second wiring region includes a plurality of contacts, each of which couples the first metal layer and the second metal layer, and
the virtual line connecting the contacts in the third region has a curvature larger than a curvature of a virtual line connecting the contacts in the second wiring region.

\* \* \* \* \*